United States Patent [19]

Chen

[11] Patent Number: 5,376,831
[45] Date of Patent: Dec. 27, 1994

[54] POWER SWITCH CIRCUIT PROVIDING LINEAR VOLTAGE RISE

[75] Inventor: Zhong X. Chen, Framingham, Mass.

[73] Assignee: International Business Machines Corporation, Armonk, N.Y.

[21] Appl. No.: 126,283

[22] Filed: Sep. 24, 1993

[51] Int. Cl.$^5$ .................. H03K 17/00; H03L 5/00
[52] U.S. Cl. .................... 327;379; 327/111; 327/427
[58] Field of Search ............ 307/296.1, 296.6, 291, 307/293, 246, 251, 542, 544, 592, 241, 571

[56] References Cited

U.S. PATENT DOCUMENTS

| | | | |
|---|---|---|---|
| 4,876,463 | 10/1989 | Lyle | 307/246 |
| 4,877,982 | 10/1989 | Walker | 307/246 |
| 5,041,889 | 8/1991 | Kriedt et al. | 307/542 |

*Primary Examiner*—William L. Sikes
*Assistant Examiner*—Fetsum Abraham
*Attorney, Agent, or Firm*—Arthur J. Samodovitz

[57] ABSTRACT

A switch circuit controllably supplies initial current from a power supply to a load to prevent a current surge when the switch circuit is "hot-plugged" or when power is first applied to the switch circuit. The circuit comprises an output transistor having a first port for connection to a load, a second port for connection to the power supply and a third port for on/off control. A first resistor is connected between the second and third ports. A second resistor and a first capacitor are connected in series with each other between the first and third ports. The second resistor is large enough such that the transistor is biased off when the power supply is first connected to the second port. A timer changes the voltage at the third port a predetermined time after application of the power supply to the second port so as to bias the output transistor to begin a limited conduction of current between the first and second ports. This current increases in a controlled manner as the capacitor discharges until the output transistor is turned-on fully to supply operating current.

13 Claims, 2 Drawing Sheets

POWER SWITCH CIRCUIT PROVIDING LINEAR VOLTAGE RISE

BACKGROUND OF THE INVENTION

The invention relates generally to power switch circuitry to soft start a load, i.e. prevent initial current surge to a capacitive load.

In some systems, a single DC power source is used for more than one subsystem. In a maintenance operation, it may be necessary to replace one of the subsystems without shutting off the power. If the new subsystem contains a capacitive load (such as in a DC to DC power converter) and no surge protection is provided, then an instantaneous current surge will result when the subsystem is first plugged in. Such a current surge is undesirable because it can cause noise in the ground plane of the other subsystem and temporarily dip the DC voltage. Undesirable current surges can also occur when DC power is applied to a capacitive load via a switch.

It was previously known to include various types of surge protection circuits. A simple surge protection circuit comprises an inductor in series with the DC voltage source. However, such an inductor is expensive and causes some steady state power dissipation. Alternately, a current limiting resistor can be connected in series with the output of the DC source. This causes the same steady state power dissipation.

U.S. Pat. No. 5,063,303 discloses another technique wherein a very low Rds MOSFET provides output current through its drain to source path from a 5 volt supply. This path is activated by a gate bias network which charges a capacitor from a 24 volt supply located on the bus.

U.S. Pat. No. 3,852,623 discloses a timing circuit for energizing an output line a predetermined time after energization of a start of input line. The timer charges a capacitor through an FET operating in a self-biased mode so that purportedly current flow is constant and voltage rise is linear with time. However, this circuit includes a series resistor at the output.

A general object of the present invention is to provide a power switch circuit which provides a linear rise in voltage and subsequent low output impedance during normal operation.

SUMMARY OF THE INVENTION

The invention resides in a switch circuit for controllably supplying initial current from a power supply to a load to prevent a current surge when the switch circuit is "hot-plugged" or when power is first applied to the switch circuit. The circuit comprises an output transistor having a first port for connection to a load, a second port for connection to the power supply and a third port for on/off control. A first resistor is connected between the second and third ports. A second resistor and a first capacitor are connected in series with each other between the first and third ports. The first second resistor is large enough such that the transistor is biased off when the power supply is first connected to the second port. A timer changes the voltage at the third port a predetermined time after application of the power supply to the second port so as to bias the output transistor to begin a limited conduction of current between the first and second ports. This current increases in a controlled manner until the output transistor is turned-on fully to supply operating current.

DETAILED DESCRIPTION OF THE PREFERRED EMBODIMENTS

Figure 1:
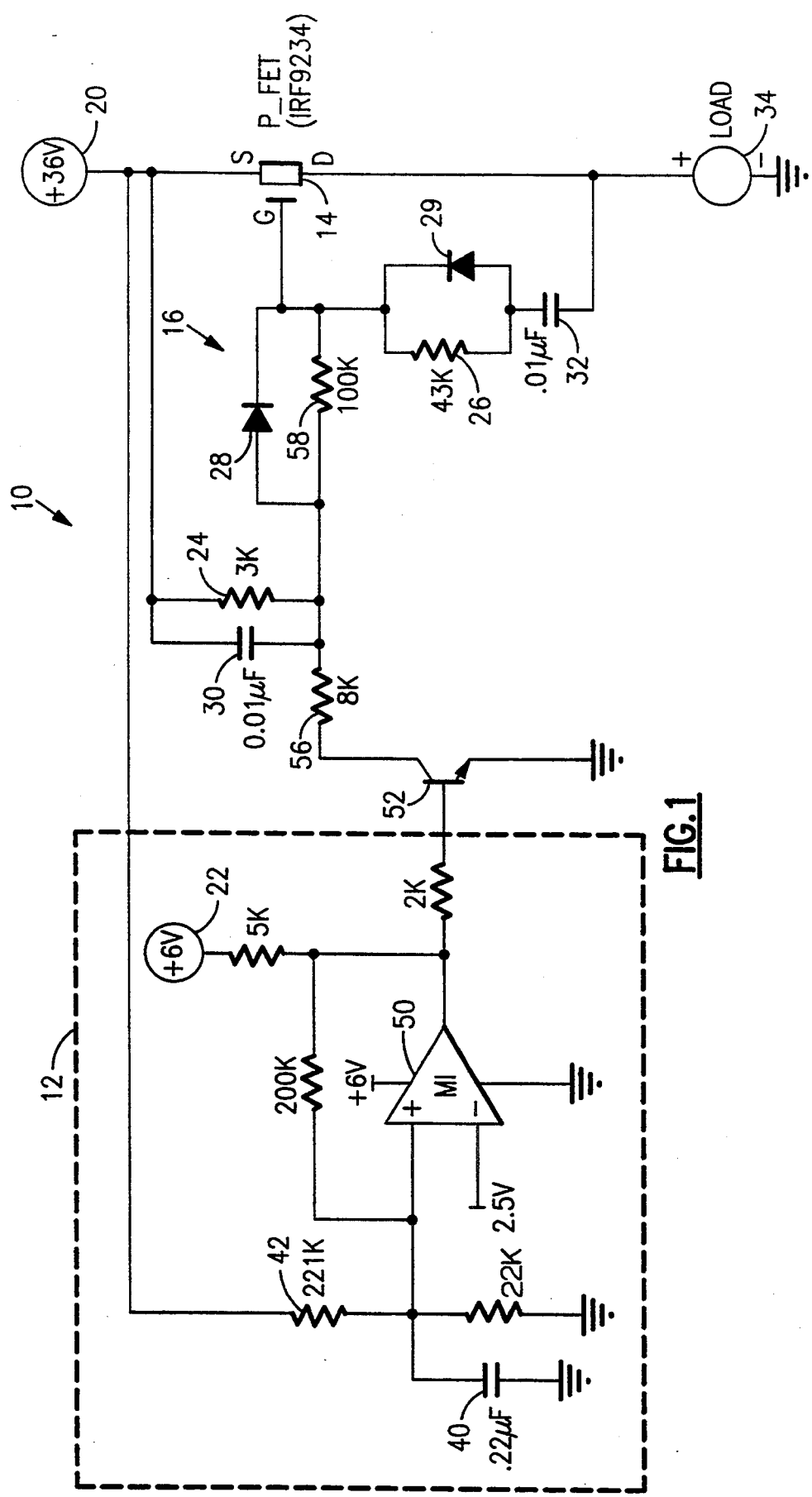
FIG. 1 is a circuit diagram of a (single ended) power switch circuit according to the present invention.

Referring now to the drawings in detail wherein like reference numerals indicate like elements throughout the figures, FIG. 1 illustrates a power switch circuit generally designated 10 according to the present invention. The values for resistors, capacitors and voltage supplies and part number for a transistor illustrated in FIG. 1 represent but one example of the present invention. Circuit 10 comprises a timing subcircuit 12, a low impedance output P-FET transistor 14 and transistor control subcircuit 16. At the moment circuit 10 is "hot-plugged", i.e. installed while DC power supplies 20 and 22 are on, the voltage of supply 20 is developed across a resistor 26 except for a 0.7 voltage drop across forward biased diode 28 and negligible drop across a capacitor 30, capacitor 32 and load 34 which also includes a parallel capacitor. In the illustrated example, this results in approximately 35 volts at the gate of transistor 14 and a Vgs of approximately −1 volts. Because of the intrinsic properties of the P-FET transistor 14, the absolute value of this Vgs is not large enough to turn-on transistor 14. (The P-FET transistor requires a negative Vgs of 4 volts or greater absolute value to turn-on.) Immediately after installation, capacitor 32 begins to charge from DC power source 20 through a resistor 24, diode 28 and resistor 26. However, this charging of capacitor 32 maintains the Vgs of transistor 14 at −1 volt and keeps transistor 14 off. Meanwhile a capacitor 40 in the delay subcircuit 12 also begins to charge from power source 20 via a resistor 42. The charging time constant of capacitor 40 is larger than the charging time constant of capacitor 32. Consequently, the voltage rise of capacitor 40 is slower than the voltage rise of capacitor 32. Some time later, the voltage of capacitor 40 reaches the threshold voltage (in the illustrated example 2.5 volts) of a comparator 50 within the delay subcircuit. At this time capacitor 32 has charged to a much higher voltage. Then, comparator 50 outputs a high level which activates a transistor 52. The collector-emitter path of transistor now couples the gate of transistor 14 to ground via a resistor 56 and a resistor 58. Consequently, the voltage at the gate of transistor 14 begins to fall. When Vgs reaches the threshold for partially activating transistor 14, transistor 14 becomes partly turned-on and begins to conduct a limited amount of current to load 34. However, this current increases the voltage at the load. Because the series capacitor 32 and resistor 26 are connected between the load and the gate of transistor 14, this rise in load voltage increases the voltage at the gate of transistor 14. As long as capacitor 32 retains a substantial amount of the charge developed before activation of transistor 52, the increase of the load voltage will keep the voltage at the gate of transistor 14 high enough to limit the output current, i.e. not fully turn on transistor 14. As capacitor 32 discharges and the resultant voltage across capacitor 32 decreases, the load voltage increases a complimentary amount. Because the rate of discharge of capacitor 32 is nearly constant, the increase of load voltage is nearly linear in accordance with the object of the present invention. The rate of increase of the load voltage is inversely proportional to the magnitude of capacitor 32 and is substantially independent of the load. When capacitor 32 is substantially discharged then transistor 14 will turn on completely and supply operating current to the load with a low output impedance. However, this is designed to be after the capacitive element in the load is substantially charged so that surge current is avoided.

Capacitor 30 is included in parallel with resistor 24 to prevent a high voltage spike at the moment of installation of circuit 10 due to the inherent gate to drain capacitance of transistor 14. However, because capacitor 30 combined with resistor 24 yields a small time constant it has little affect on the charging of capacitor 32 and the output voltage.

Figure 2:
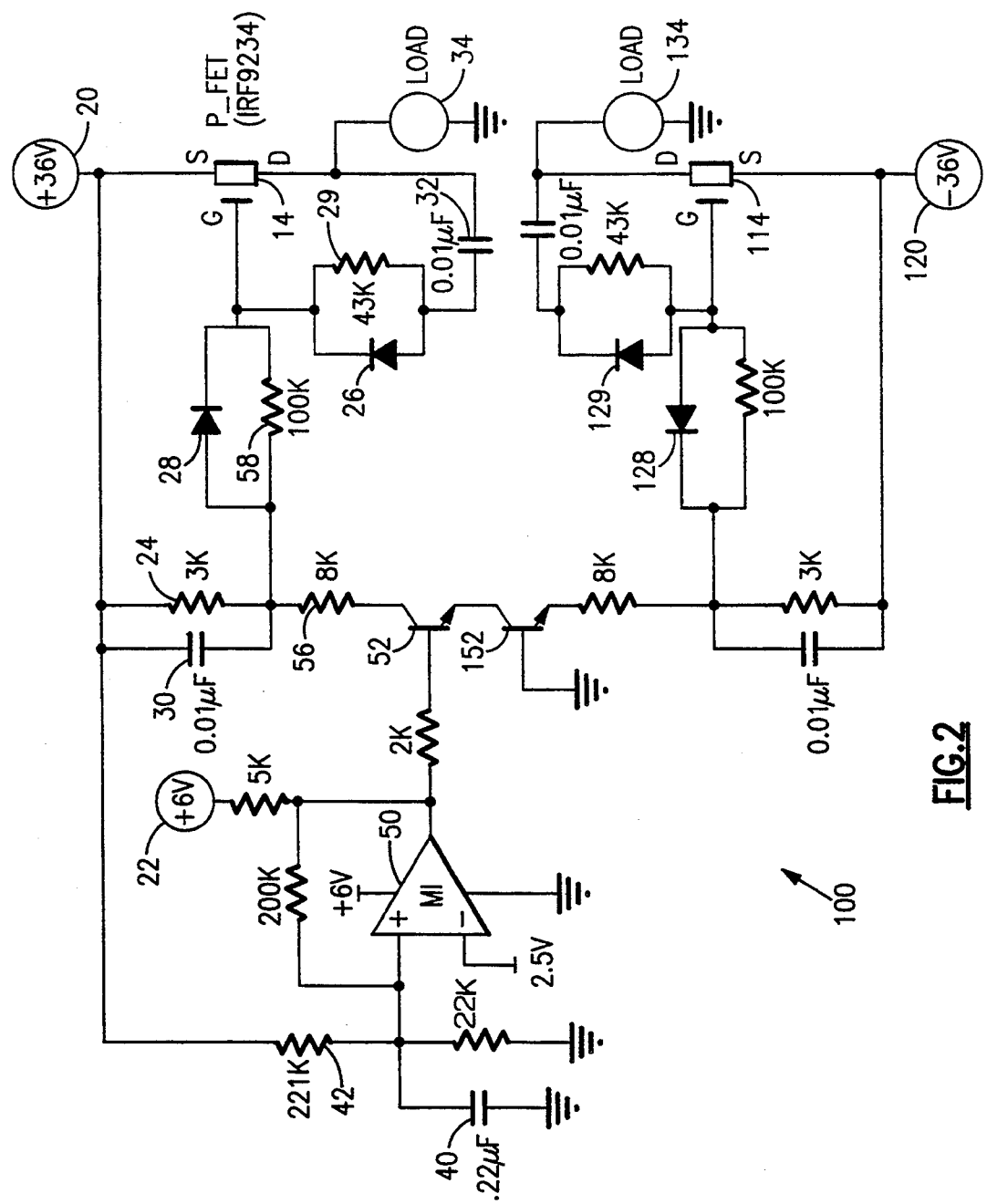
FIG. 2 is a circuit diagram of a double ended power switch circuit according to the present invention.
Figure 2:
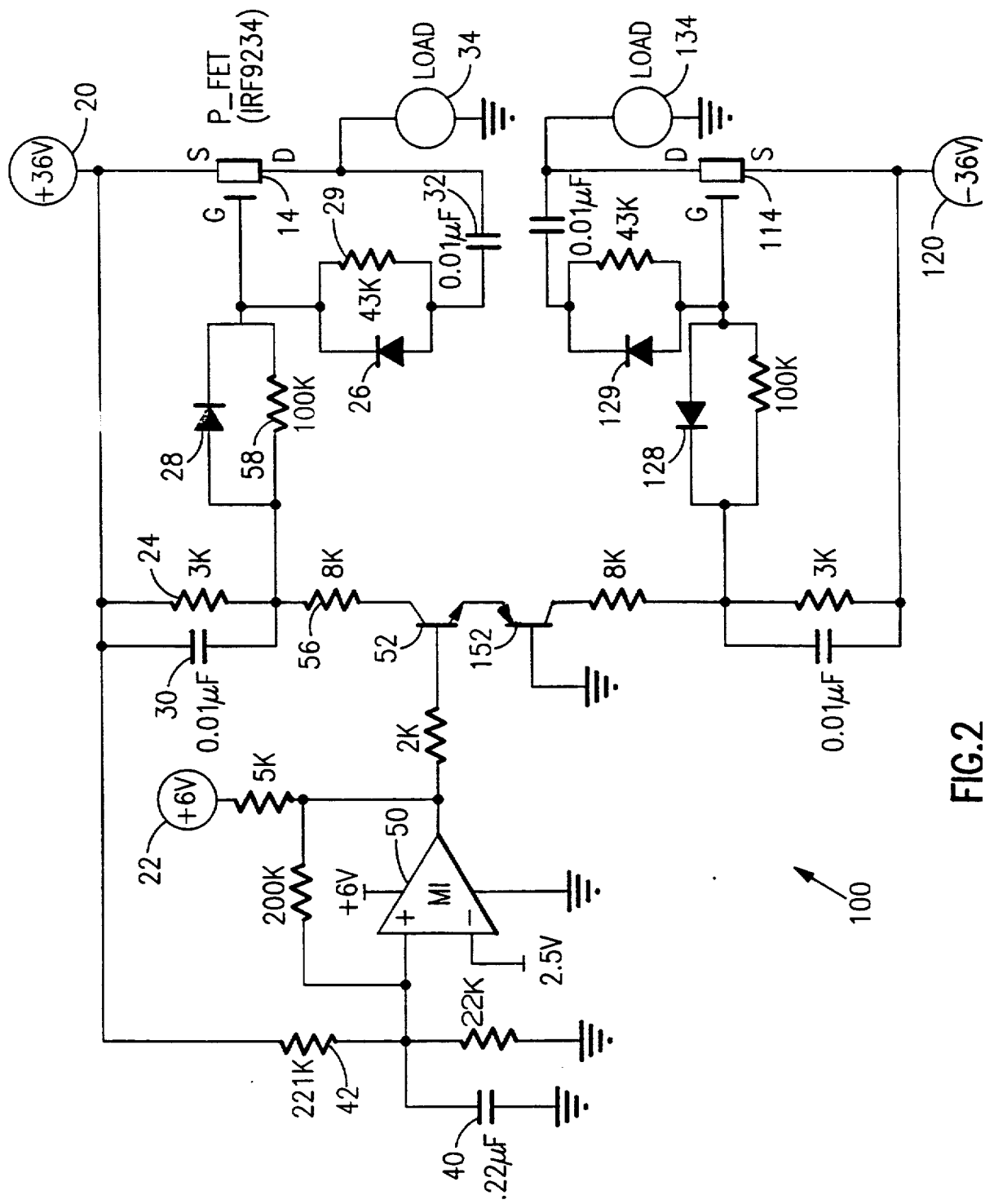

FIG. 2 illustrates another power switch circuit generally designated 100 according to the present invention. Circuit 100 provides a nearly linear rate of voltage increase for two, opposite polarity power supplies 20 and 120. Circuit 100 includes all of the components of circuit 10 to provide the linear voltage output from positive power supply 20 as described above and nearly identical circuitry to provide the linear voltage output from negative power supply 120. The only difference is the use of N-FET output transistor 114 and the corresponding reversal of polarities of transistors 128 and 129 in the circuitry which provides the linear voltage output for negative power supply 120. Otherwise, the operation is the same.

There is another feature built into both circuits 10 and 100 to prevent output power from transistors 12 and 112 if power supply 20 exhibits less than the threshold voltage of comparator 50. In such a case, capacitor 40 will never charge to a level greater than the threshold voltage for comparator 50, and transistor 52 in circuit 10 and transistors 52 and 152 in circuit 100 will never turn on. Consequently, output transistor 14 in circuit 10 and output transistors 14 and 114 in circuit 100 will never turn on for reasons stated above when power supply 20 exhibits less than the threshold voltage.

Based on the foregoing, power supply switches according to the present invention have been disclosed. However, numerous modifications and substitutions can be made without deviating from the scope of the present invention. As noted above, the values for resistors, capacitors, and power supplies and part numbers for output transistors are just one example of the present invention; other values and part numbers based on the specified power supply voltages and optimum output voltage increase rate in keeping with the described operation will suffice. Therefore, the present invention has been disclosed by way of illustration and not limitation and reference should be made to the following claims to determine the scope of the present invention.

I claim:

1. A switch circuit for controllably supplying current from a power supply to a load, said circuit comprising:
   an output transistor having a first port for connection to a load, a second port for connection to the power supply and a third port for on/off control;
   a first resistor connected between said second and third ports;
   a second resistor and a first capacitor connected in series with each other between said first and third ports, said second resistor being large enough such that said transistor is biased off when said power supply is first connected to said second port; and
   control means for changing the voltage at said third port a predetermined time after connection of said power supply to said second port to partially activate said output transistor to conduct in a limiting manner current between said second and first ports.

2. A switch circuit as set forth in claim 1 wherein said output transistor is a P-FET.

3. A switch circuit as set forth in claim 2 wherein said power supply exhibits a positive voltage.

4. A switch circuit as set forth in claim 1 wherein said output transistor is an N-FET.

5. A switch circuit as set forth in claim 4 wherein said power supply exhibits a negative voltage.

6. A switch circuit as set forth in claim 1 wherein said control means comprises:
   a second capacitor;
   means for charging said second capacitor from said power supply at a controlled rate;
   means for comparing a voltage of said second capacitor to a threshold; and
   means, responsive to an output of said comparing means, for changing the voltage at said third port to cause said partial activation of said output transistor.

7. A switch circuit as set forth in claim 1 wherein said control means comprises a switch coupled between said third port and ground.

8. A switch circuit as set forth in claim 7 further comprising a third resistor connected between said switch and said third port.

9. A switch circuit as set forth in claim 1 further comprising means for biasing said output transistor fully on a time after the limited conduction begins.

10. A switch circuit as set forth in claim 1 wherein said control means comprises:
    a switch;
    a third resistor connected between said third port and said switch; and
    a diode connected between said first capacitor and said third port with a polarity such that after said predetermined time, said switch discharges said first capacitor via said diode and said third resistor.

11. A switch circuit as set forth in claim 10 wherein said third resistor is connected between said third port and said first resistor.

12. A switch circuit as set forth in claim 11 further comprising another diode connected across said third resistor with a polarity such that said other diode delivers current to said third port after said predetermined period.

13. A switch circuit as set forth in claim 1 further comprising means, including said control means and said first capacitor, for causing a load voltage to rise substantially linearly with time after said predetermined period.

* * * * *

UNITED STATES PATENT AND TRADEMARK OFFICE
CERTIFICATE OF CORRECTION

PATENT NO.   :   5,376,831
DATED        :   December 27, 1994
INVENTOR(S)  :   Z. X. Chen It is certified that error appears in the above-identified patent and that said Letters Patent is hereby corrected as shown below:

The sheet of drawing, consisting of figure 2, should be deleted to appear as per attached sheet.

Signed and Sealed this

Ninth Day of May, 1995

*Attest:*

BRUCE LEHMAN

*Attesting Officer*      *Commissioner of Patents and Trademarks*